(12) United States Patent
Hsu

(10) Patent No.: US 12,543,585 B2
(45) Date of Patent: Feb. 3, 2026

(54) SEMICONDUCTOR STRUCTURE AND MANUFACTURING METHOD THEREOF

(71) Applicant: UNITED MICROELECTRONICS CORP., Hsin-Chu (TW)

(72) Inventor: Yi-Feng Hsu, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 645 days.

(21) Appl. No.: 17/891,090

(22) Filed: Aug. 18, 2022

(65) Prior Publication Data

US 2024/0014082 A1 Jan. 11, 2024

(30) Foreign Application Priority Data

Jul. 6, 2022 (TW) .................................. 111125385

(51) Int. Cl.
| | |
|---|---|
| *H01L 23/13* | (2006.01) |
| *H01L 21/48* | (2006.01) |
| *H01L 23/367* | (2006.01) |
| *H01L 23/373* | (2006.01) |

(52) U.S. Cl.
CPC .......... *H01L 23/13* (2013.01); *H01L 21/4871* (2013.01); *H01L 23/3672* (2013.01); *H01L 23/3733* (2013.01)

(58) Field of Classification Search
CPC ....... H01L 23/34–4735; H01L 21/4882; H10F 77/60–68
See application file for complete search history.

(56) References Cited

U.S. PATENT DOCUMENTS

| | | | | | |
|---|---|---|---|---|---|
| 5,403,783 | A | * | 4/1995 | Nakanishi | H01L 24/83 438/455 |
| 5,825,087 | A | * | 10/1998 | Iruvanti | H01L 24/83 257/E23.103 |
| 5,838,065 | A | * | 11/1998 | Hamburgen | H01L 23/3738 257/722 |
| 6,018,192 | A | * | 1/2000 | Root | H01L 23/34 257/E23.098 |
| 6,225,695 | B1 | * | 5/2001 | Chia | H10D 62/117 257/713 |
| 6,710,442 | B1 | * | 3/2004 | Lindgren | H01L 24/31 257/E23.102 |
| 7,361,972 | B2 | * | 4/2008 | Chen | H10D 62/117 257/E29.022 |
| 9,281,228 | B2 | * | 3/2016 | Choi | H10D 62/117 |
| 9,431,316 | B2 | * | 8/2016 | Pagaila | H01L 23/36 |
| 10,163,754 | B2 | * | 12/2018 | Ho | H01L 23/3675 |
| 10,224,268 | B1 | * | 3/2019 | Xu | H01L 21/4871 |
| 10,566,270 | B2 | * | 2/2020 | Xu | H01L 23/49568 |
| 2004/0041255 | A1 | * | 3/2004 | Lindgren | H01L 23/367 257/E23.102 |

(Continued)

*Primary Examiner* — Scott B Geyer
(74) *Attorney, Agent, or Firm* — Winston Hsu

(57) ABSTRACT

The invention provides a semiconductor structure, which comprises a chip comprising a substrate, wherein the substrate has a front surface and a back surface, and the front surface of the substrate comprises a circuit layer, the back surface of the substrate comprises a plurality of microstructures, and a thermal interface material located on the back surface of the substrate, and the thermal interface material contacts the microstructures directly.

8 Claims, 5 Drawing Sheets

(56) References Cited

U.S. PATENT DOCUMENTS

| | | | |
|---|---|---|---|
| 2006/0128068 A1* | 6/2006 | Murray | H01L 21/4882 |
| | | | 438/120 |
| 2006/0232932 A1* | 10/2006 | Curtis | H01L 21/4882 |
| | | | 257/E23.103 |
| 2007/0235847 A1* | 10/2007 | Ramanathan | H01L 23/3677 |
| | | | 257/E23.105 |
| 2008/0081176 A1* | 4/2008 | Huang | H01L 23/3677 |
| | | | 428/323 |
| 2008/0106868 A1* | 5/2008 | Hoss | H01L 23/3737 |
| | | | 257/E23.102 |
| 2010/0187683 A1* | 7/2010 | Bakir | H01L 23/53276 |
| | | | 257/713 |
| 2011/0272824 A1* | 11/2011 | Pagaila | H01L 23/3677 |
| | | | 257/777 |
| 2012/0241941 A1* | 9/2012 | Kim | H01L 23/367 |
| | | | 438/122 |
| 2013/0188319 A1* | 7/2013 | Yamaguchi | H05K 7/2039 |
| | | | 361/717 |
| 2015/0184053 A1 | 7/2015 | Krishnan | |
| 2015/0279761 A1* | 10/2015 | Bet-Shliemoun | H01L 23/42 |
| | | | 257/714 |
| 2017/0092619 A1* | 3/2017 | Refai-Ahmed | H01L 23/04 |
| 2019/0006269 A1* | 1/2019 | Xu | H01L 21/4871 |
| 2020/0258808 A1* | 8/2020 | Bunyan | H01L 23/42 |
| 2020/0260609 A1* | 8/2020 | Saha | H05K 1/0206 |
| 2020/0350229 A1* | 11/2020 | Chang | H05K 7/20309 |
| 2021/0098335 A1 | 4/2021 | Yu | |
| 2021/0249326 A1* | 8/2021 | Uppal | H01L 23/42 |
| 2021/0249342 A1 | 8/2021 | Choi | |
| 2022/0102234 A1* | 3/2022 | Das Mahapatra | H01L 23/36 |
| 2022/0262697 A1* | 8/2022 | Fang | H01L 23/3142 |
| 2023/0180434 A1* | 6/2023 | Shia | H05K 7/20381 |
| | | | 361/700 |

* cited by examiner

SEMICONDUCTOR STRUCTURE AND MANUFACTURING METHOD THEREOF

BACKGROUND OF THE INVENTION

1. Field of the Invention

The invention relates to the field of semiconductor manufacturing, in particular to a semiconductor structure for improving the heat dissipation efficiency of a chip and a manufacturing method thereof.

2. Description of the Prior Art

With the progress of semiconductor manufacturing, the size of semiconductor chips is getting smaller and smaller, so the semiconductor chips need to accommodate more components in a limited chip area. At the same time, as the performance requirements of the chips are gradually increased, it is easier for the semiconductor chips to generate heat when running them efficiently. If the semiconductor chip is overheated, the performance of the semiconductor chip will be reduced or even damaged. Therefore, it is one of the research directions in this field to improve the heat dissipation effect of semiconductor wafers without increasing excessive cost.

SUMMARY OF THE INVENTION

The invention provides a semiconductor structure, which comprises a chip, wherein the chip comprises a substrate, wherein the substrate has a front side and a back side, and the front side of the substrate comprises a circuit layer disposed thereon, the back side of the substrate comprises a plurality of microstructures, and a thermal interface material located on the back side of the substrate, and the thermal interface material directly contacts the microstructures.

The invention also provides a manufacturing method of a semiconductor structure, which comprises providing a substrate, wherein the substrate has a front surface and a back surface, forming a circuit layer on the front surface of the substrate, forming a plurality of microstructures on the back surface of the substrate, and forming a thermal interface material on the back surface of the substrate, wherein the thermal interface material directly contacts the microstructures.

The present invention is characterized in that a plurality of microstructures (such as holes or grooves) are formed on the back surface of the substrate of the wafer, and then the thermal interface material is filled into the microstructures, and the heat sink is connected to the thermal interface material. Because the microstructure increases the surface area of the back of the substrate, the heat dissipation efficiency of the semiconductor chip can be improved after the thermal interface material is filled in the microstructure. The invention has the advantages of compatibility with existing processes and improvement of the efficiency of semiconductor chips.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
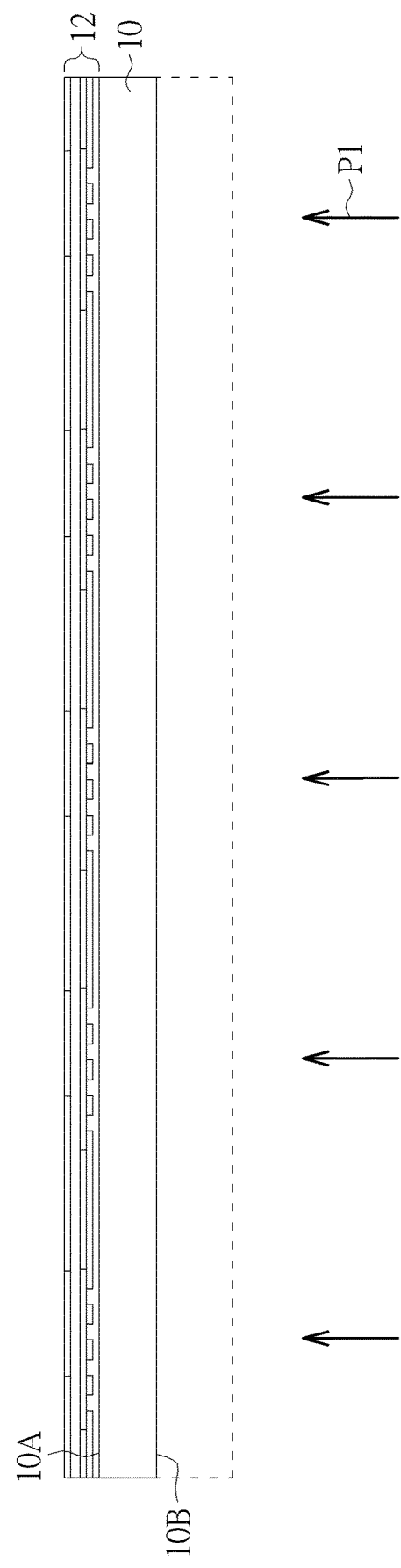
FIG. 1 to FIG. 4 are schematic diagrams of manufacturing a semiconductor structure according to the first embodiment of the present invention.

Please refer to FIG. 1 to FIG. 4, which are schematic diagrams of manufacturing the semiconductor structure of the present invention. First, as shown in FIG. 1, a substrate 10, such as a silicon wafer, or other substrates commonly used in semiconductor processes, such as a group III-V element substrate (group III-V element such as gallium nitride), a silicon germanium substrate, a silicon carbide substrate, a silicon-on-insulator, SOI), etc., can be applied to the substrate of the present invention, and the present invention is not limited thereto. The substrate 10 includes a front surface 10A and a back surface 10B. The front surface 10A of the substrate 10 is formed with a circuit layer 12. The circuit layer 12 includes various types of electronic components (such as common transistors, resistors, capacitors, memories, wires, contact structures, etc., but is not limited to this), and the circuit layer 12 may be composed of multiple layers stacked on each other. Here, the circuit layers 12 have different combinations according to the functions of the wafer to be formed, and the fabrication method and structure of the circuit layers 12 belong to the conventional technology in the field, so they will not be described in detail here. In addition, the substrate 10 (for example, a wafer) described here will be cut into a plurality of dies by a cutting step in the subsequent steps, which will be described in the subsequent paragraphs.

Referring to FIG. 1, in some embodiments of the present invention, a thinning step P1 can be selectively performed on the back surface 10B of the substrate 10, wherein the thinning step P1 is, for example, a chemical mechanical polishing (CMP) to reduce the thickness of the substrate 10 to meet the specification requirements of semiconductor wafers. In addition, reducing the thickness of the substrate also helps to improve the heat dissipation effect of the semiconductor wafer. However, it is worth noting that in other embodiments of the present invention, the thinning step P1 described in FIG. 1 can be selectively omitted, that is, after the circuit layer 12 is formed on the substrate 10, the next step can be directly performed without the thinning step. This embodiment also belongs to the scope of the present invention.

Figure 2:
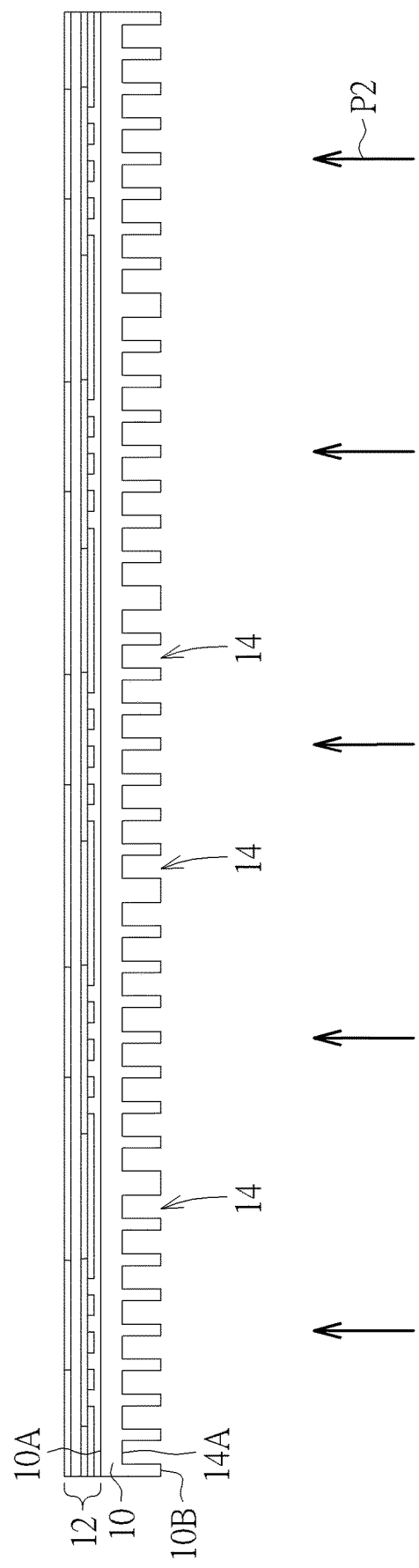

Then, as shown in FIG. 2, a photolithography and etching step P2 is performed on the back surface 10B of the substrate 10 to form a plurality of microstructures 14 on the back surface of the substrate 10, wherein the microstructures 14 here include, for example, a plurality of grooves or holes, and the difference between the grooves and the holes is that, from a top view, the grooves may have a long strip structure, while the holes may have a round hole or a square hole-like structure, and the microstructures 14 may also include the combination of grooves and holes. Besides, the depth, the opening size and the spacing of the grooves and holes may be the same or different, all of which belong to the scope of the present invention. In addition, a bottom surface 14A of the microstructure 14 is defined here.

In addition, the density and distribution of grooves and holes can also be adjusted in other embodiments of the present invention. For example, the density of the grooves or the holes can be increased in a component dense area of the wafer, and the density of the grooves or the holes can be decreased in other peripheral areas, etc. Such embodiments also belong to the scope of the present invention.

The purpose of forming the microstructure 14 here is to increase the surface area of the back surface 10B of the substrate 10. In the subsequent step, a thermal interface material (TIM) will be coated or attached to the back surface 10B of the substrate 10. If the surface area of the back surface 10B of the substrate 10 is increased, the heat dissipation effect of the substrate can be further improved.

Figure 3:
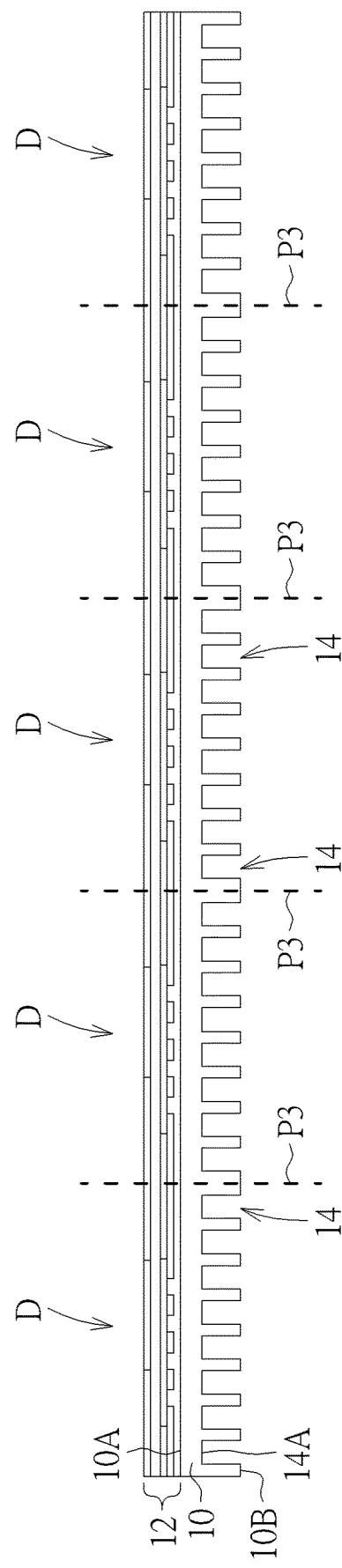

Then, as shown in FIG. 3, after the microstructure 14 is formed, a cutting step P3 is performed to cut the substrate 10 (for example, a whole wafer structure) into a plurality of dies D. Here, the difference between the die and the chip according to the present invention will be explained. As shown in FIG. 3, the structure of the substrate 10 and the circuit layer 12 after cutting is defined as the die D, which will be packaged in the subsequent step, and the packaged die D is defined as the chip.

Figure 4:
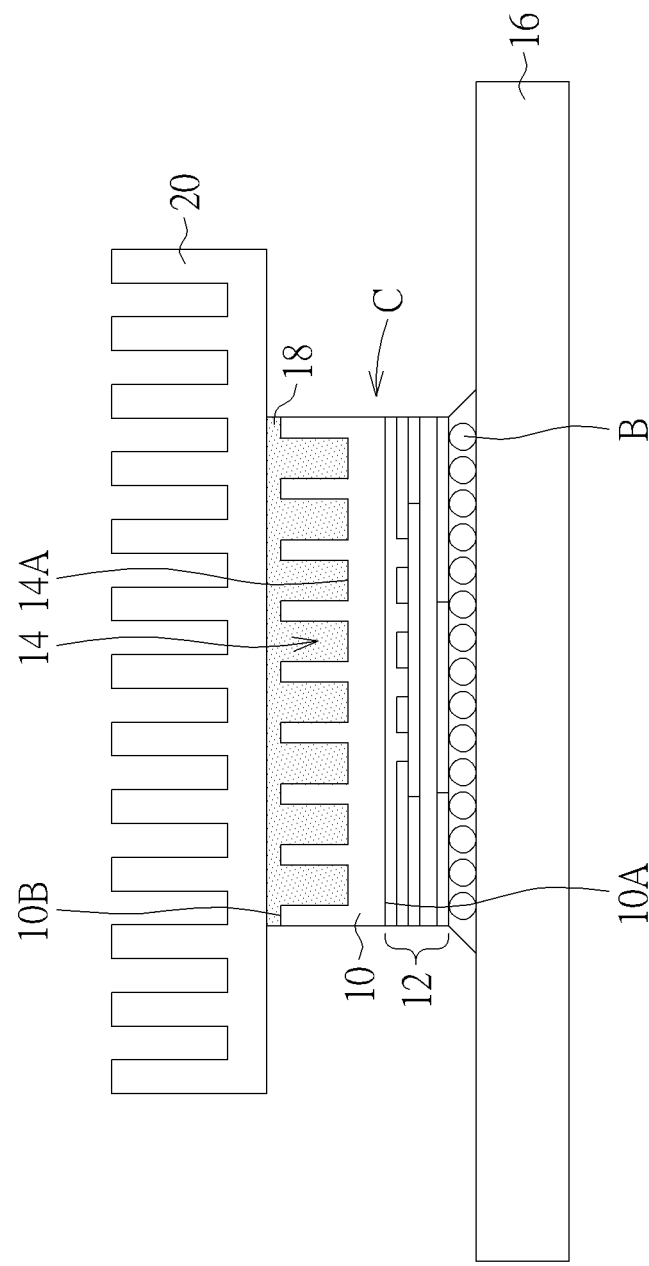

Next, the cut die D is packaged to form a chip, and is electrically connected to the printed circuit board, and a thermal interface material and heat sink are formed therein. The technical content of packaging belongs to the conventional technology in the field, so it will not be repeated here. Specifically, as shown in FIG. 4, a printed circuit board 16 is provided, and then a packaging step is carried out, and the die D shown in FIG. 3 is packaged to form a chip C, and the circuit layer 12 of the chip C can be electrically connected to the printed circuit board 16 by means of solder B, pins or wires, etc. The technical content of this part belongs to the conventional technology in the field, so it will not be repeated here. It is worth noting that, in order to improve the heat dissipation effect of the packaged chip, a heat sink 20 can be connected to the thermal interface material 18 by coating or attaching the thermal interface material 18 on the back surface 10B of the substrate 10. The thermal interface material 18 in the present invention is, for example, a glue layer containing metal particles, wherein the metal particles can be selected from metals with better thermal conductivity, such as silver particles. The thermal interface material 18 used in the present invention is formed by mixing the metal particles with the glue layer. The thermal interface material 18 fills into the microstructure 14, and the thermal interface material 18 directly contacts the bottom surface 14A of the microstructure 14 (such as the grooves or the holes), so as to improve the heat dissipation effect of the back surface 10B of the substrate 10. In addition, the thermal interface material 18 is connected to the heat sink 20. The heat sink 20 here is made of metal or other materials with good thermal conductivity. The heat sink 20 has a large contact surface area with air, so it has a good heat-dissipating effect. Preferably, the area of the heat sink 20 is larger than that of the die D. In some embodiments, the heat sink 20 has a structure composed of a plurality of parallel plates. In other embodiments of the present invention, the heat sink 20 may have different structures, such as a sheet metal layer or a metal mesh structure, or the lead frame used in the packaging step may be used as the heat sink 20, that is, the lead frame can have the function of heat dissipation besides the function of connecting elements. The above-mentioned various heat sinks 20 are all within the scope of the present invention.

Figure 5:
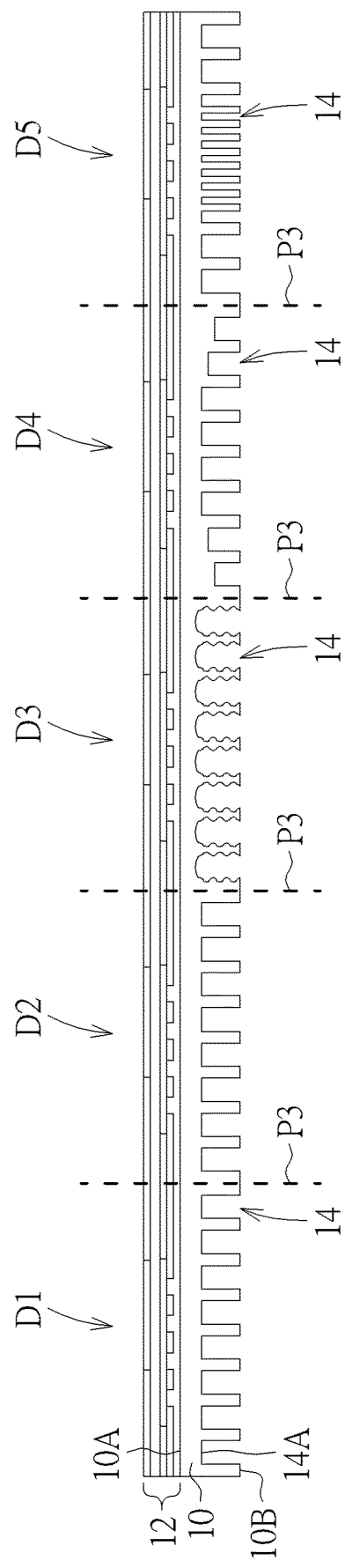
FIG. 5 is a schematic diagram of a semiconductor structure according to another embodiment of the present invention.

FIG. 5 is a schematic diagram of a semiconductor structure according to another embodiment of the present invention. Referring to FIG. 5, this embodiment is similar to the structure shown in FIG. 3, but the difference of this embodiment and the first embodiment mentioned above is that the microstructures 14 with different densities, different arrangements, different shapes or different depths can be formed in different dies (such as die D1, die D2, die D3, die D4 and die D5 in FIG. 5). For example, some dies (such as die D1 and die D2) have the same microstructure size, shape or arrangement, but other dies (such as die D3, die D4 and die D5) may have different microstructure sizes, shapes or arrangement densities. Specifically, in this embodiment, the roughness of the microstructure surface of some or all dies (for example, the die D3 shown in FIG. 5) can be further improved by multiple oxidation or etching, so as to further improve the surface area of microstructure 14. In the die D4, a part of the microstructures 14 have deeper depth, and the other part of the microstructures 14 have shallower depth. For example, the area near the center of the die D4 is where the main components are located, and its microstructures 14 are deeper, so it also has a good heat dissipation effect, but the present invention is not limited to this. In addition, the density of microstructures 14 distributed in the same die D5 may also be different (for example, the density of microstructures 14 near the middle element region is higher than that in the peripheral region). Next, after the dies D1-D5 with various microstructures 14 shown in FIG. 5 are cut in the cutting step P3, they can be packaged and mounted on the printed circuit board 16 as shown in FIG. 4 to form the thermal interface material 18 and the heat sink 20. The related steps are the same as those described in the above paragraphs, so they will not be repeated here.

According to the above description and drawings, the present invention provides a semiconductor structure, which comprises a substrate 10, wherein the substrate 10 has a front surface 10A and a back surface 10B, and the front surface 10A of the substrate 10 includes a circuit layer 12, and the back surface 10B of the substrate 10 includes a plurality of microstructures 14, and a thermal interface material 18 located on the back surface 10B of the substrate 10 and in contact with the microstructures 14.

In some embodiments of the present invention, a heat sink 20 is further included, which is located on the back surface 10B of the substrate 10 and is in contact with the thermal interface material 18.

In some embodiments of the present invention, the heat sink 20 is a lead frame.

In some embodiments of the present invention, the thermal interface material 18 contains metal particles.

In some embodiments of the present invention, the material of the metal particles is silver.

In some embodiments of the present invention, a printed circuit board 16 is further included, and the circuit layer 12 on the substrate 10 is electrically connected with the printed circuit board 16.

In some embodiments of the present invention, the microstructure 14 includes a plurality of grooves or holes.

In some embodiments of the present invention, the thermal interface material 18 is completely filled in the grooves or holes, and the thermal interface material 18 directly contacts a bottom surface 14A of the grooves or holes.

Another aspect of the present invention provides a manufacturing method of a semiconductor structure, which includes providing a substrate 10, wherein the substrate 10 has a front surface 10A and a back surface 10B, forming a circuit layer 12 on the front surface 10A of the substrate 10, forming a plurality of microstructures 14 on the back surface 10B of the substrate 10, and forming a thermal interface material 18 on the back surface 10B of the substrate 10 and directly contacts the microstructures 14.

In some embodiments of the present invention, a heat sink 20 is formed on the back surface 10B of the substrate 10, and is in contact with the thermal interface material 18.

In some embodiments of the present invention, the thermal interface material 18 contains metal particles.

In some embodiments of the present invention, the material of the metal particles is silver.

Some embodiments of the present invention further include providing a printed circuit board 16, wherein the circuit layer 12 on the substrate 10 is electrically connected with the printed circuit board 16.

In some embodiments of the present invention, the microstructure 14 includes a plurality of grooves or holes.

In some embodiments of the present invention, the thermal interface material 18 is completely filled in the grooves or holes, and the thermal interface material 18 directly contacts a bottom surface 14A of the grooves or holes.

In some embodiments of the present invention, it further includes thinning the substrate 10 (the thinning step P1 in FIG. 1) before forming the microstructure 14 on the back surface 10B of the substrate 10.

In some embodiments of the present invention, after the circuit layer 12 and a plurality of microstructures 14 are formed, a cutting step P3 is further performed to cut the electrically connected substrate 10 and the circuit layer 12 into a plurality of dies.

In some embodiments of the present invention, the method of forming the microstructure 14 includes a photolithography and etching step P2.

The present invention is characterized in that a plurality of microstructures (such as holes or grooves) are formed on the back surface of the substrate of the wafer, and then the thermal interface material is filled into the microstructures, and the heat sink is connected to the thermal interface material. Because the microstructure increases the surface area of the back surface of the substrate, the heat dissipation efficiency of the semiconductor chip can be improved after the thermal interface material is filled in the microstructure. The invention has the advantages of compatibility with existing processes and improvement of the efficiency of semiconductor chips.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a chip comprising a substrate, wherein the substrate has a front side and a back side, and the front side of the substrate comprises a circuit layer, and the back side of the substrate comprises a plurality of microstructures, wherein the microstructure comprises a plurality of grooves or holes, and wherein a sidewall of each microstructure is rougher than a bottom surface of each microstructure; and
   a thermal interface material located on the back side of the substrate and in contact with the microstructures, wherein the thermal interface material comprises a glue layer mixed with metal particles.

2. The semiconductor structure according to claim 1, further comprising a heat sink located on the back side of the substrate and in contact with the thermal interface material.

3. The semiconductor structure according to claim 2, wherein the heat sink is a lead frame.

4. The semiconductor structure according to claim 1, wherein the material of the metal particles is silver.

5. The semiconductor structure according to claim 1, further comprising a printed circuit board, wherein the circuit layer on the substrate is electrically connected with the printed circuit board.

6. The semiconductor structure according to claim 1, wherein the thermal interface material is filled in the grooves or the holes, and the thermal interface material directly contacts a bottom surface of the grooves or the holes.

7. A semiconductor structure, comprising:
   a chip comprising a substrate, wherein the substrate has a front side and a back side, and the front side of the substrate comprises a circuit layer, and the back side of the substrate comprises a plurality of microstructures, wherein at least one of the plurality of the microstructures has a greater depth than another microstructure of the plurality of the microstructures; and
   a thermal interface material located on the back side of the substrate and in contact with the microstructures, wherein the thermal interface material comprises a glue layer mixed with metal particles.

8. A semiconductor structure, comprising:
   a chip comprising a substrate, wherein the substrate has a front side and a back side, and the front side of the substrate comprises a circuit layer, and the back side of the substrate comprises a plurality of microstructures, wherein a middle element region of the back side has a higher density of the microstructures than a peripheral region of the back side; and
   a thermal interface material located on the back side of the substrate and in contact with the microstructures, wherein the thermal interface material comprises a glue layer mixed with metal particles.

* * * * *